United States Patent
Tsuchida et al.

[11] Patent Number: 5,933,380
[45] Date of Patent: Aug. 3, 1999

[54] SEMICONDUCTOR MEMORY DEVICE HAVING A MULTILAYERED BITLINE STRUCTURE WITH RESPECTIVE WIRING LAYERS FOR READING AND WRITING DATA

[75] Inventors: Kenji Tsuchida, Kawasaki; Yukihito Oowaki; Kazunori Ohuchi, both of Yokohama, all of Japan

[73] Assignee: Kabushiki Kaisha Toshiba, Kawasaki, Japan

[21] Appl. No.: 08/871,587

[22] Filed: Jun. 9, 1997

[30] Foreign Application Priority Data

Jun. 11, 1996 [JP] Japan .................................... 8-149312

[51] Int. Cl.$^6$ ...................................................... G11C 7/02
[52] U.S. Cl. ...................... 365/207; 365/51; 365/230.03; 365/205
[58] Field of Search ........................ 365/150, 51, 230.03, 365/202, 203, 205, 207

[56] References Cited

U.S. PATENT DOCUMENTS

| | | | |
|---|---|---|---|
| 5,014,241 | 5/1991 | Asakura et al. | 365/51 |
| 5,495,440 | 2/1996 | Asakura | 365/149 |
| 5,555,203 | 9/1996 | Shiratake et al. | 365/51 |
| 5,610,871 | 3/1997 | Hidaka | 365/230.03 |

FOREIGN PATENT DOCUMENTS

61-48194  3/1986  Japan .

Primary Examiner—David Nelms
Assistant Examiner—Hoai V. Ho
Attorney, Agent, or Firm—Oblon, Spivak, McClelland, Maier & Neustadt, P.C.

[57] ABSTRACT

A semiconductor memory device includes a memory cell array having a plurality of memory cells, the memory cell array being divided into a plurality of blocks, a plurality first bitlines arranged in each of the blocks, the plurality of first bitlines forming a plurality of first bitline pair each having a folded bitline structure with two of the plurality of first bitlines as a basic unit, a plurality second bitlines arranged to correspond to at least one of the blocks and formed above the first bitlines, the plurality of second bitlines forming a plurality of second bitline pair each having a folded bitline structure with two of the plurality of second bitlines as a basic unit, a plurality of sense amplifier circuits, arranged to correspond to the plurality of second bitline pairs, for detecting and amplifying information stored in the memory cells, and a plurality of select circuits for selecting one of two of first bitlines included in one of the plurality of first bitline pairs to selectively connect a selected first bitline with one of two of second bitlines included in one of the plurality of second bitline pairs.

20 Claims, 7 Drawing Sheets

FIG. 10

SEMICONDUCTOR MEMORY DEVICE HAVING A MULTILAYERED BITLINE STRUCTURE WITH RESPECTIVE WIRING LAYERS FOR READING AND WRITING DATA

BACKGROUND OF THE INVENTION

This invention relates to a semiconductor memory device wherein memory cells are integratedly allocated, more particularly, to a semiconductor memory device having multilayered bitline structure in which data lines (bitlines) for reading/writing data from/into memory cells are formed of two different wiring layers.

A dynamic random access memory (DRAM) is the most integrated device in the MOS-type semiconductor memory devices since each of the memory cells constituting the device has a relatively simple memory cell structure. Recently, the samples of 64 Mbit DRAM has been put into market, and some prototype of the 1 Gbit DRAM has been presented. The integration density of the DRAM has been enhanced not only by the improvement of the fine-processing technique, but also by constructing the memory cells three-dimensionally. The three-dimensional constitution of the device can remarkably reduce the area of each of the memory cells.

The three-dimensional memory cell structure can be roughly classified into a trench cell and a stack cell. As the stack cell, a COB (Capacitor Over Bitline) type stack cell in which a capacitor is formed above a bitline has been generally used.

Figure 1A:
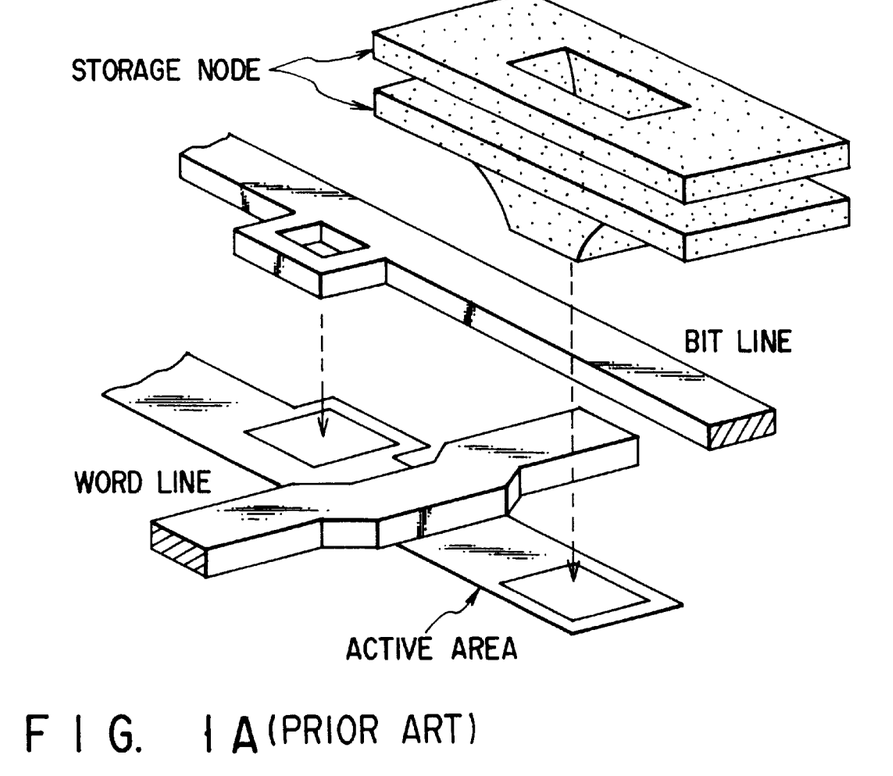
FIGS. 1A and 1B show a birds-eye view and a plan view of the conventional COB type stack cell, respectively.
Figure 1B:
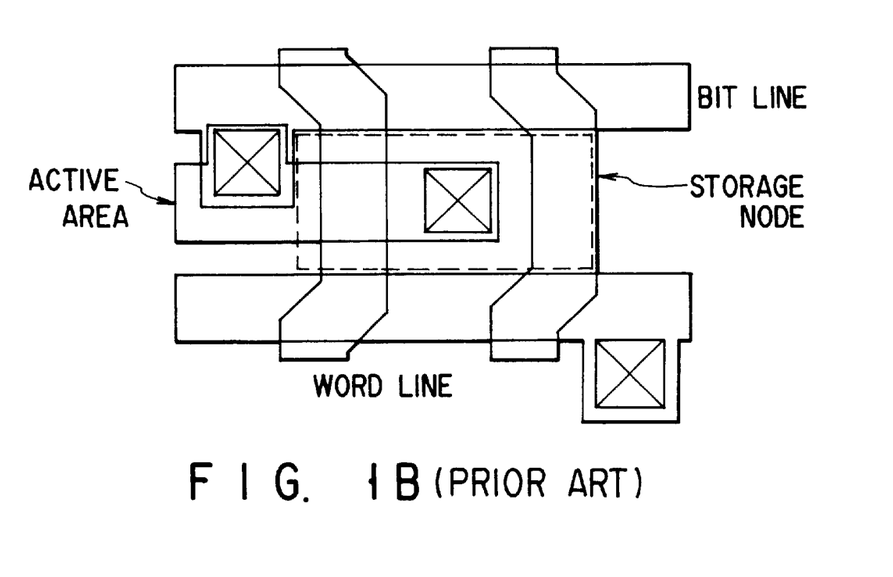

FIGS. 1A and 1B respectively show a birds-eye view and a plan view of the conventional COB type stack cell, respectively. In the conventional COB type stack cell, the cell capacitor is formed above the bitline. Thus, a contact hole is formed between the adjacent bitlines such that a storage node as the lower electrode of a capacitor is connected with the active area therethrough. In this structure, the storage node shields the coupling capacitance between the bitlines, and the interference noise between the bitlines can be reduced, in comparing with the trench cell.

The COB type stack cell, however, is larger than the trench cell in the capacity between the bitline and the storage node. The total bitline capacity that is larger than that of the trench cell when the same number of cells in the trench cell are connected, and the power consumption necessarily increases in comparing with the trench cell. Further, when the capacity of the memory cell capacitor is determined at a predetermined level, so large amount of the total bitline capacity causes the decrease of the level of the signal input to the sense amplifier, thereby resulting the decrease of the reading margin.

The above-mentioned problems must be solved in such a manner that the power consumption is decreased to the equivalent level of the trench cell, and the level of the signal input to the sense amplifier is increased. To realize them, those skilled in the art would be easily think to further divide the bitlines to decrease the number of the cell connected to each of the bitlines. As the specific proposal, the multilayered bitline structure has been proposed.

Figure 2:
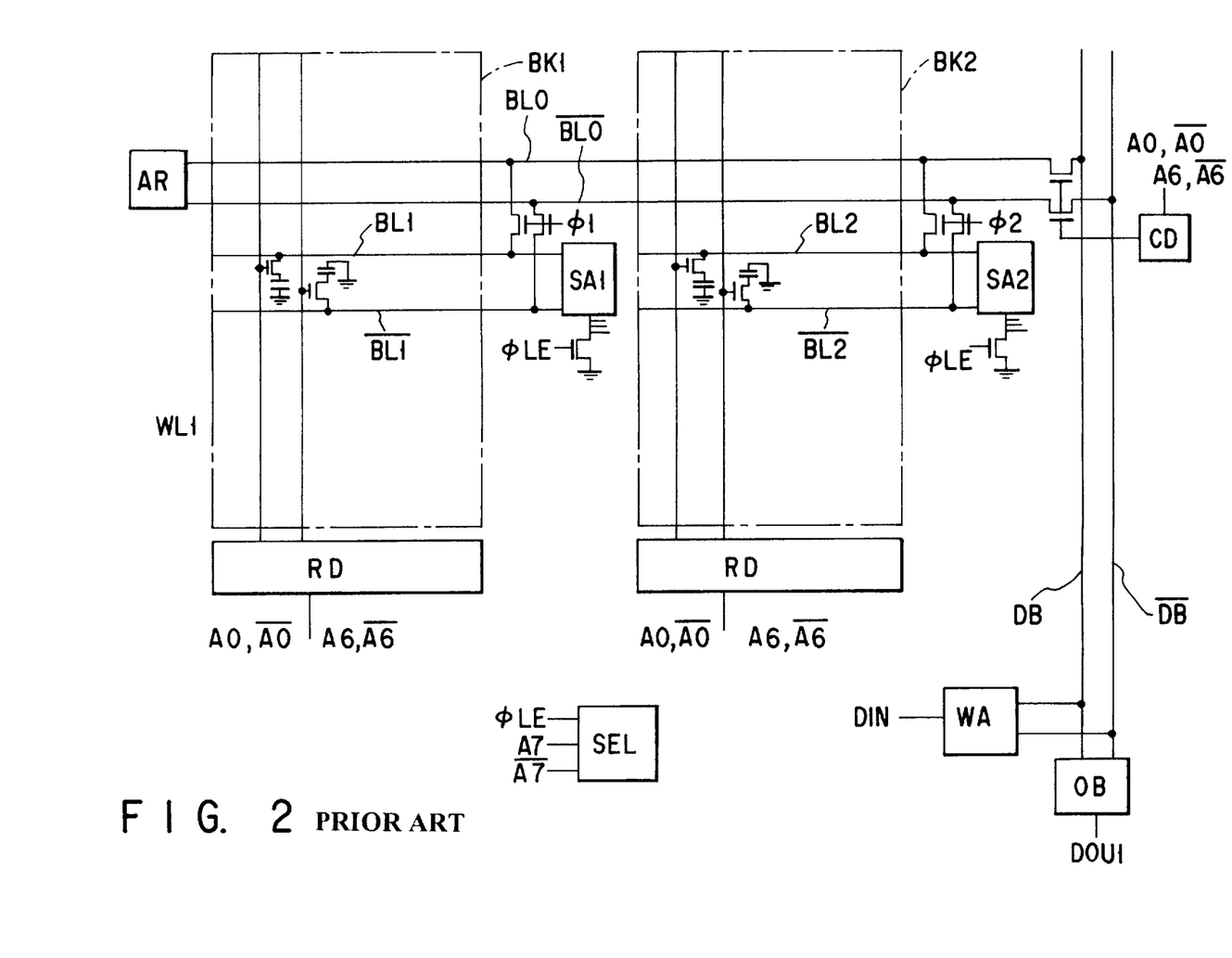
FIG. 2 is a block diagram of the memory device having the conventional multilayered bitline structure.

FIG. 2 is a block diagram of a memory device having the multilayered bitline structure. In this structure, a plurality of lower bitlines (SBLs:Segment Bitlines, indicated in the diagram as BL1, /BL1, BL2, /BL2) each having a relatively short length are respectively shared by the upper bitlines (MBLs:Master Bitlines, indicated in the diagram as BL0, /BL0).

With this structure, the MBLs are shared by a plurality of blocks (BK1, BK2), and thus have a relatively long length. The MBLs are therefore generally formed of a metal wiring made from Al in consideration of the data transmission speed in the MBLs. The metal wiring cannot be easily formed thin in comparing with the wiring made from a material such as polyside, and has a thickness larger than that defined by the design rule. Further, the MBL is formed on the upper electrode of the capacitor of the COB type stack cell, and thus are not shielded by the storage node, in comparing with the SBLs. As a result, the capacity present between the adjacent MBLs will remarkably increase.

In addition, the MBLs are shared by a plurality of the SBLs as described above, and have the relatively long wiring length, the reading noise in the MBLs exceedingly increases therefor. The employment of the multilayered bitline structure in the COB type stack cell causes the problem of the noise between the bitlines which has been solved by employing the COB type stack cell, and the operation margin of the sense amplifier will be decreased thereby.

BRIEF SUMMARY OF THE INVENTION

The object of the present invention is to provide a semiconductor memory having a novel multilayered bitline structure particularly capable of reducing the interference noise caused by the coupling capacitance in the upper bitlines (MBL section), even in the multilayered bitline structure applied to the COB type stack cell.

In order to solve the aforementioned problem, the device of the present invention comprises: a memory cell array having a plurality of memory cells, the memory cell array being divided into a plurality of blocks; a plurality first bitlines arranged in each of the blocks, the plurality of first bitlines forming a plurality of first bitline pair each having a folded bitline structure with two of the plurality of first bitlines as a basic unit; a plurality second bitlines arranged to corresponding to at least one of the blocks and formed above the first bitlines, the plurality of second bitlines forming a plurality of second bitline pair each having a folded bitline structure with two of the plurality of second bitlines as a basic unit; a plurality of sense amplifier circuits, arranged to corresponding to the plurality of second bitline pairs, for detecting and amplifying information stored in the memory cells; and a plurality of select circuits for selecting one of two of first bitlines included in one of the plurality of first bitline pairs to selectively connect a selected first bitline with one of two of second bitlines included in one of the plurality of second bitline pairs.

The device of the present invention of another aspect comprises: a memory cell array having a plurality of memory cells, the memory cell array being divided into a plurality of blocks; a plurality first bitlines arranged in each of the blocks, the plurality of first bitlines forming a plurality of first bitline pair each having a folded bitline structure with two of the plurality of first bitlines as a basic unit; a plurality second bitlines arranged to corresponding to at least one of the blocks and formed above the first bitlines, the plurality of second bitlines forming a plurality of second bitline pair each having a folded bitline structure with two of the plurality of second bitlines as a basic unit; a plurality of sense amplifier circuits, arranged to corresponding to the plurality of second bitline pairs, for detecting and amplifying information stored in the memory cells; and a plurality of select circuits for selecting one of two of first bitlines included in one of the plurality of first bitline pairs to selectively connect a selected first bitline with one of two of second bitlines included in one of the plurality of second bitline pairs, wherein two pairs of the plurality of second bit pairs constitute one unit, and one of two second bitlines included in one of the two pairs of the plurality of second bit pairs is put between another bitline pair of the two pairs of the plurality of second bit pairs, and each of the plurality of select circuits connects a first bitline of the plurality of first line pairs connected to the selected memory cell with a second bitline included one of two of the plurality of second bitline pairs put between another pairs of two of the plurality of second bitline pairs.

The preferred embodiments of the present invention will be described below.

(1) The memory cell is a dynamic memory cell having one transistor and one capacitor;

(2) Each of the plurality of second bitline pairs has a first end and a second end, and the plurality of sense amplifiers are arranged on a side of the first end and a side of the second end;

(3) The plurality of second bitline pairs are connected to the sense amplifiers arranged on a side of the first end and the sense amplifiers arranged on a side of the second end, alternately;

(4) Data stored in the memory cells are read to the two of the plurality of second bitlines being adjacent and arranged at every two lines intervals, regardless of an input address;

(5) Each of the memory cells has a memory cell capacitor formed above the plurality of first bitline pairs;

(6) The select circuits are arranged on both ends of each of the plurality of blocks;

(7) The device further comprises an equalizing circuit for maintaining voltages of the plurality of first bitlines at a predetermined precharge potential, the equalizing circuit provided to each of the plurality of blocks;

(8) The equalizing circuit is shared by adjacent two blocks of the plurality of blocks;

(9) Each of the sense amplifier circuits is shared by two of the plurality of second bitline pairs, and further comprises an equalizing circuit for maintaining voltages of the plurality of second bitlines of each of the second bitline pairs at a arbitrary precharge level; and (10) The equalizing circuit performs a precharge operation of the plurality of second bitline pairs through the plurality of select circuits.

According to the present invention, the first bitline (SBL) for reading data from a memory cell is connected to a second bitline (MBL) which constitutes a second bitline pair (SBL pair) by a select circuit between the first and second bitline pair and is located between second bitlines constituting the other second bitline pair. By arranging the first and second bitlines in this manner, noise is transferred to the bitlines of the other second bitline pair adjacent to the second bitline through which the data is read out. The noise transferred to the bitlines of the other second bitline pair, however, is offset each other since the second bitline pair has a folded bitline structure and the sense amplifier circuit is a differential amplifier.

More specifically, the interference noise generated due to the coupling capacitance between the adjacent MBLs when the data is read from the memory cell can be reduced. Accordingly, a large margin for the operation of the sense amplifier can be attained even in the multilayered bitline structure employing the COB type stack cell. By construct- ing the device in this manner, both low power consumption and high reliability in operation can be attained.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

This invention can be more fully understood from the following detailed description when taken in conjunction with the accompanying drawings.

First Embodiment

Figure 3:
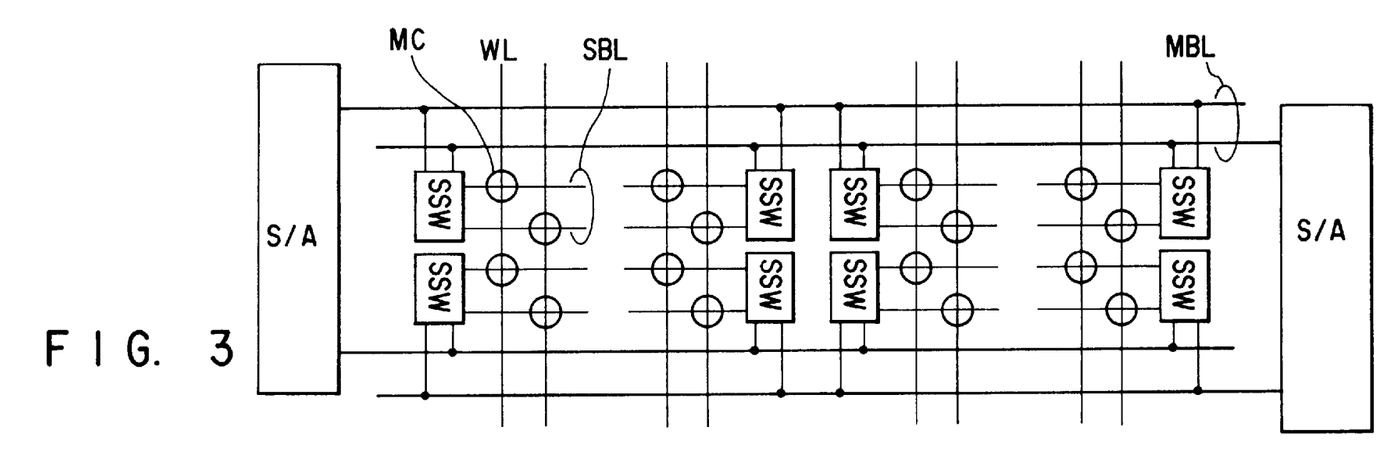
FIG. 3 is a schematic diagram showing a basic structure of the multilayered bitline structure of the memory device according to the first embodiment.

FIG. 3 is a schematic diagram showing a basic structure of the multilayered bitline structure of the memory device according to the first embodiment.

To simplify the drawing of the device shown in FIG. 3, only four blocks each having two pairs of lower bitlines (SBLs) and circuits corresponding to two upper bit (MBL) pairs selectively connected to these SBLs are shown. The actual memory device has a plurality of sets (512, 1024, or 2048 sets, for example) of the four blocks and the two upper bit pairs, arranged with high integration density. Similarly, although FIG. 3 shows that a MBL pair is provided outside of each of the two SBL pairs for simplicity of the drawing, each MBL pair is actually provided above the corresponding one of the two SBL pairs, and the MBL and SBL are arranged at the same intervals.

The device according to the present embodiment is provided with a plurality of memory cells (MCs) which are selectively controlled on the basis of the relationship of the potentials of word lines (WLs), and a plurality of lower bitlines (SBLS) connected to the memory cells. Each of the MCs is the dynamic memory cell comprising one transistor and one capacitor. At an end of the SBL line, a segment switch circuit for receiving/sending data from/to the upper bitlines (MBLs) is allocated.

The SSW circuit electrically connects the SBL and the MBL by receiving the signal for selecting a sub-array block including a WL when the WL is selected in accordance with the externally input address signal. In this time, the other SSW circuit in the non-activated sub-array blocks electrically disconnects the SBL and the MBL. By virtue of the structure, one MBL can be shared by a plurality of SBLs (for example shown in FIG. 3, one MBL is shared by four blocks of SBLs).

At both ends of the MBL pair shared by a plurality of SBLs, a sense amplifier circuit (S/A circuit) for detecting/amplifying the data from the memory cell is allocated, thereby the data is output from the memory cell to the outside through the SBL and the MBL.

The most remarkable feature of the device according to the present embodiment is the constitution of the SSW circuit for controlling the connection of the SBLs and the MBLs, and the positional relationship between the MBL pair and the sense amplifier. More specifically, the SSW circuit is operated to be connected with one of two MBLs of the MBL pair, which is located nearer one SBL than the other MBL in accordance with the externally input address signal. To describe in more detail, the data read from the memory cell to two SBL pairs adjacent to each other is necessarily sent to one of the MBLs of the two MBL pairs, which is arranged inner in the circuit than the other one of the MBL.

A sense amplifier is allocated at both ends of two MBL pairs, and the MBLs are connected the sense amplifiers on the right and left ends alternately, and constitutes a folded bitline structure. Each of the two MBL pairs is formed such that one MBL of the MBL pair is put between the other MBL pair. With this structure, the noise generated between the adjacent MBLs can be offset and reduced.

Figure 4:
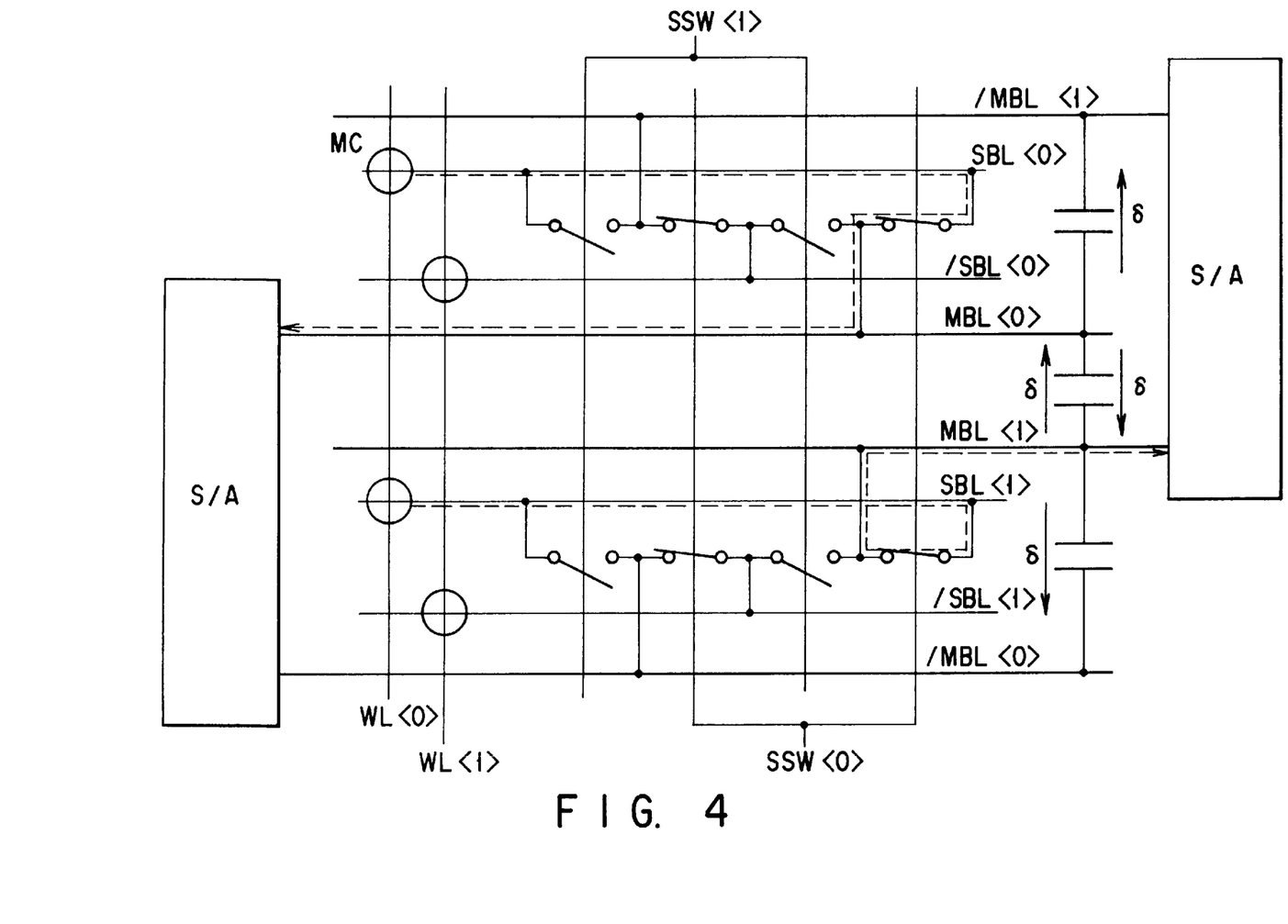
FIG. 4 is a schematic diagram showing the principle of the offset of the noise generated between the adjacent MBLs.

The above-mentioned mechanism would be more clearly understood in conjunction with FIG. 4. To simplify the drawing, only two SBL pairs and two MBL pairs are described in the diagram, but in the actual device, one MBL is shared by a plurality of SBLs, as described above. As shown in FIG. 4, when the externally applied address signal is applied to a WL <0> and the memory cells connected to SBL <0> and SBL <1> are selected by a WL <0>, a SSW <0> is activated and the switch to which the address signal is input is conducted. In this manner, the SBL <0> and SBL <1> are connected to the MBL <0> and MBL <1>, respectively. The SBL data is therefore sent to the two MBLs which are located adjacent to each other.

At right and left ends of the MBLs, a plurality of sense amplifiers are allocated, and the MBLs are alternately connected to the sense amplifiers allocated at the right and left. In this constitution, one of the MBLs connected to one sense amplifier is necessarily located between the MBLs of the other MBL pair connected to the other sense amplifier arranged opposite to the one sense amplifier.

With the above-mentioned constitution and the operation of the SSW circuit, the noise (δ) of the MBL pair generated in the reading of the memory cell data to send to the MBLs of the MBL pair is the same as that generated in the adjacent MBL pair in phase and amount. The sense amplifier is operated as a differential amplifier of the MBL pair, and thus the noise present in the MBL pair does not effect as noise. Therefore, the interference noise generated in the reading operation can be completely offset or considerably reduced by virtue of this constitution.

The same effect can be attained when the memory cell connected to the SBL <0> and SBL <1> by the externally applied address signal is selected by the WL <1>, since the SSW <1> is activated and the switch to which the external signal is input and conducted.

As described above, according to the device of the present embodiment, each MBLs is alternately connected to the sense amplifiers arranged on the sides of the array, and a SBL is necessarily connected to either of two adjacent MBLs by the switching element arranged between the MBLs and the SBLs. By virtue of this structure, the problem of the interference noise generated in the COB type stack cell using the multilayered bitline structure can be solved.

Second Embodiment

Figure 5:
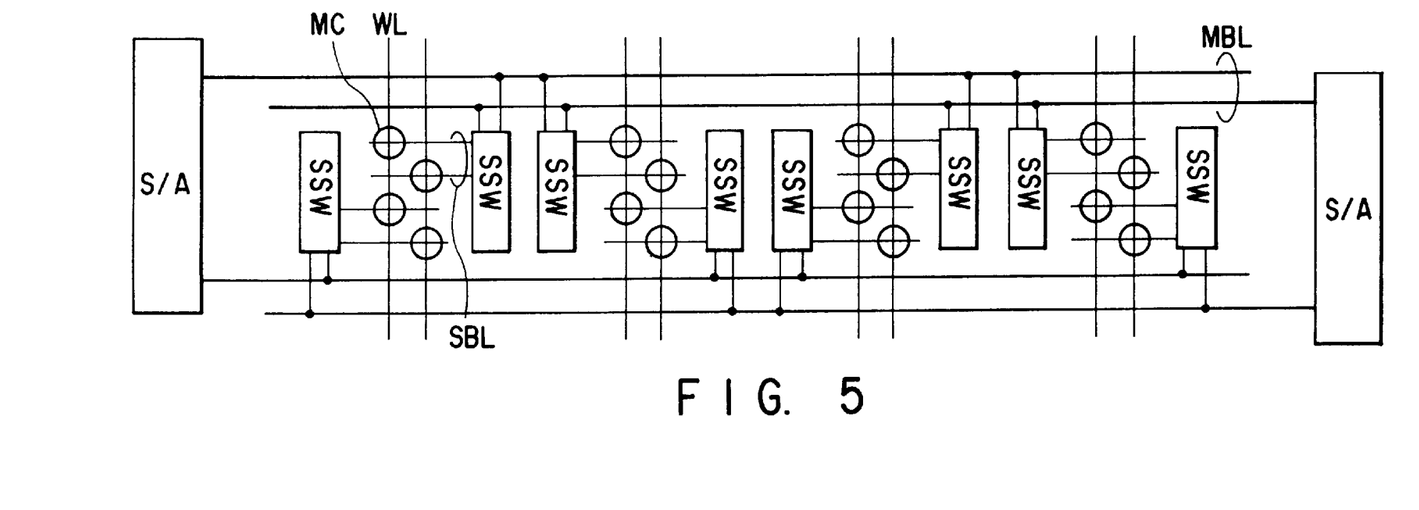
FIG. 5 is a schematic diagram showing a basic structure of the multilayered bitline structure of the memory device according to the second embodiment.

FIG. 5 is a schematic diagram showing a basic structure of the multilayered bitline structure of the memory device according to the second embodiment. The same reference numerals are used to designate the elements having the elements shown in FIG. 3 for simplicity of illustration, and the detail description is omitted.

The present embodiment differs from the first embodiment described above in the location of the SSW circuit controlling the connection of the SBLs and MBLs. In the second embodiment, SSW circuits are separated by the SBLs and located on the both ends of each of the sub-array blocks, as shown in FIG. 5

This structure can obtain not only the same effect obtained in the first embodiment, but also the pitch of the SSW circuit can be increased to four SBLs. By increasing the pitch, the design rule can be relaxed in the SSW circuit sections in comparing with that of the memory cells, and high reliability can be obtained. Further, the gate width of each of the transistors constituting each the SSW circuits is increased by increasing the pitch, thereby the data transmission speed from the SBL to the MBL or vice versa is increased and the high speed access is facilitated thereby.

Third Embodiment

Figure 6:
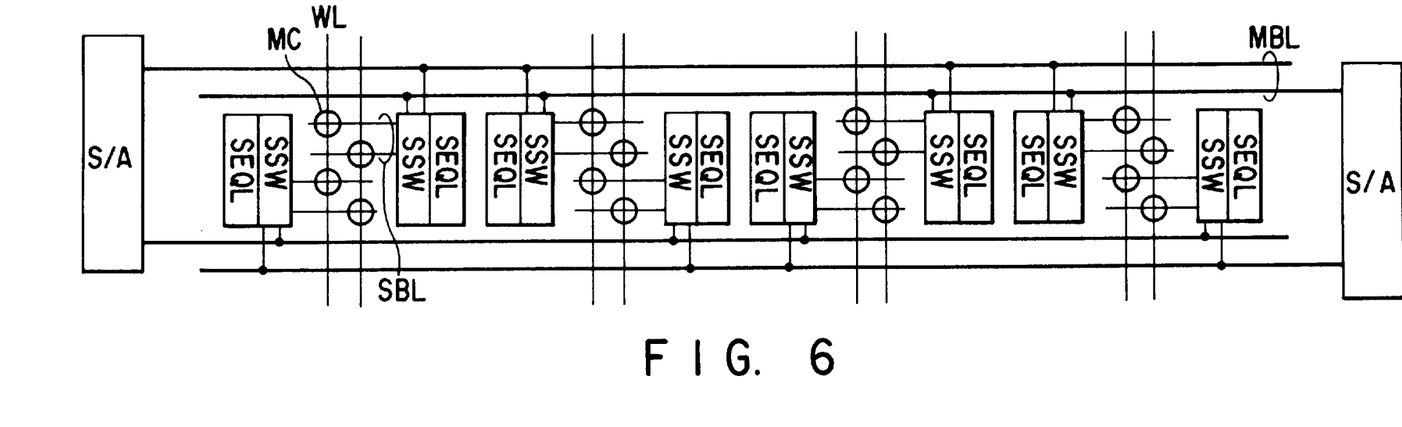
FIG. 6 is a schematic diagram showing a basic structure of the multilayered bitline structure of the memory device according to the third embodiment.

FIG. 6 is a schematic diagram showing a basic structure of the multilayered bitline structure of the memory device according to the third embodiment. The present embodiment differs from the second embodiment shown in FIG. 5 in the point that SBL equalizing circuits (SEQLs) each adjacent to the corresponding SSW circuit, which maintain the potential of each SBLs at a precharge potential, are added.

One MBL pair is shared by a plurality of SBLs and some of the SBLs are disconnected from the MBL pair by the SSW circuit. The SEQLs are arranged to maintain the potential of each SBL pair disconnected from MBL pair by the SSW circuit at a precharge potential. By arranging the SEQLs in this manner, the voltage drop due to the leakage of the junction current of the SBL pair and the MBL pair can be prevented, even if only the bitlines in the specified sub-array block is concentratedly accessed, and the bitlines in the other sub-array blocks are set at a precharge state for a relatively long period of time.

Fourth Embodiment

Figure 7:
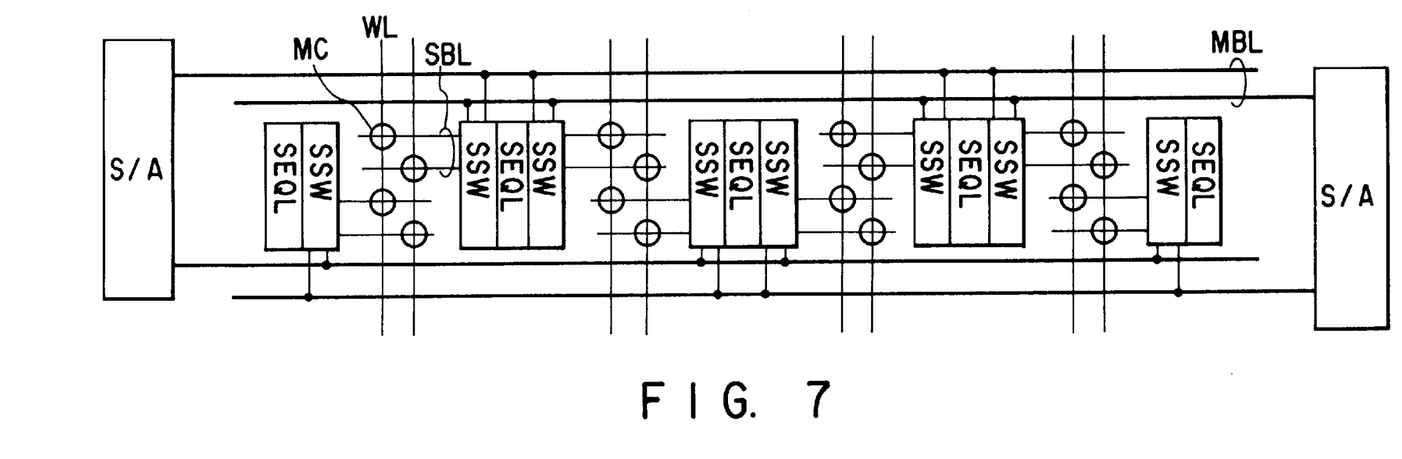
FIG. 7 is a schematic diagram showing a basic structure of the multilayered bitline structure of the memory device according to the fourth embodiment.

FIG. 7 is a schematic diagram showing a basic structure of the multilayered bitline structure of the memory device according to the fourth embodiment. The present embodiment differs from the second embodiment shown in FIG. 6 in the point that each of the SBL equalizing circuits (SEQLs) is shared by the two SBL pairs in the adjacent blocks. By arranging the SEQLs in this manner, the number of the SEQLs can be decreased, which brings the decrease in the chip area and the integration of the device is enhanced.

Figure 8:
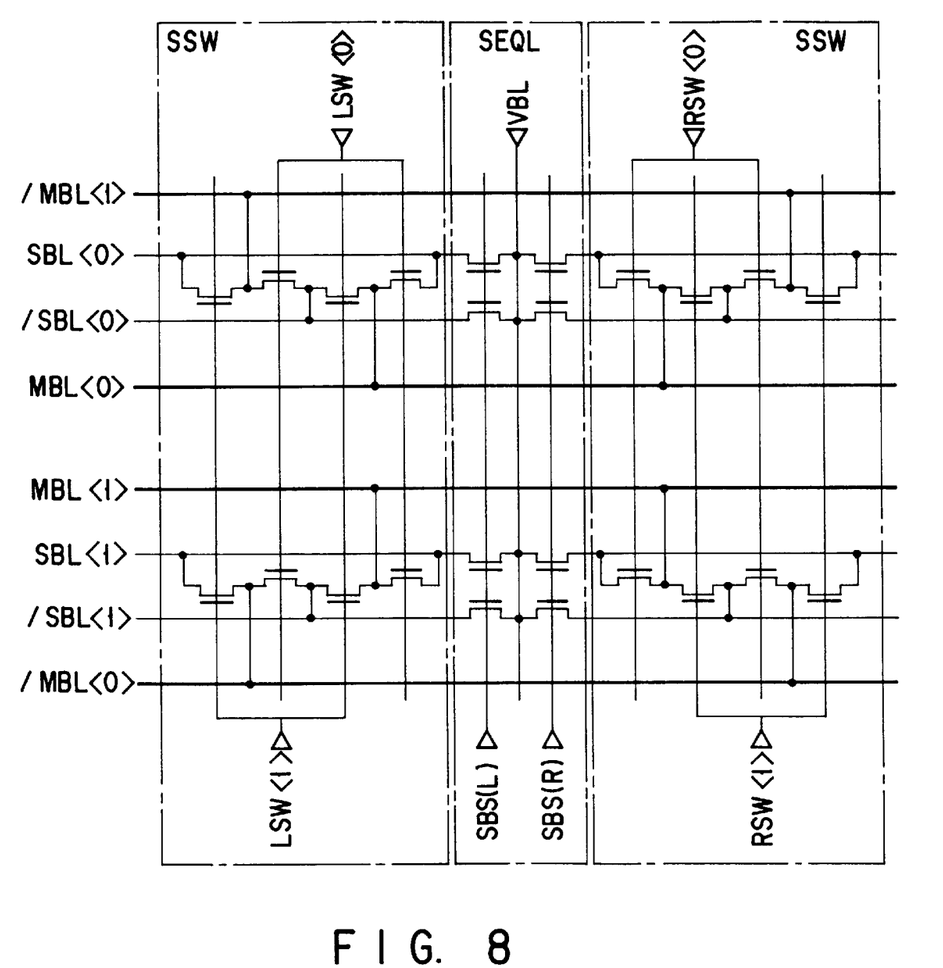
FIG. 8 is a circuit diagram showing an example of a SSW circuit and an equalizing circuit for the SBL in the multi- layered bitline structure of in the memory device according to the fourth embodiment.

FIG. 8 is a schematic diagram showing one example of the SSW circuit and the SEQLs in the multilayered bitline structure of in the memory device according to the fourth embodiment. To simplify the drawing, there are drawn on each of right and left sides a SSW circuit corresponding to four SBL pairs, and described a SEQL circuit corresponding to two MBL pairs. In the drawing, the SSW circuit for each of the SBL pairs comprises four nMOS elements, and the SEQL circuit comprises two pairs of nMOS elements.

The operation of the circuits will be described below in detail. In a precharge state, all the signals (LSW <0>, LSW <1>, RSW <0>, RSW <1>) input to the SSW circuits are maintained at a "L" level, and all the signals (SBS <L>, SBS <R>) input to the gate electrodes of the nMOS elements of the SEQL are maintained at a "H" level. All the SBLs are connected to a VBL as a precharge voltage (normally set at a VCC/2).

When RAS is activated and the memory cells connected to the SBL pair on the left side are selected, the level of the SBS <L> is turned to the "L" level, and disconnected from the SEQL circuit. If the memory cells connected to the SBL <0> and SBS <1> are selected, the memory cell data is output to the MBL <0> and MBL <1> when the LSW <0> is turned to a "H" level. If the memory cell connected to /SBL <0> and /SBL <1> is selected in this time, the memory cell data is similarly output to the MBL <0> and MBL <1> when the LSW <1> is set at a "H" level.

Similarly, if the memory cell connected to the SBL pair on the right side is selected, the SBS <R> is set at a "L" level instead of the SBS <L>, RSW <0> or RSW <1> operates instead of LSW <0> or LSW <1> according to the selected memory cells.

As described above, the MBL <0> in one MBL pair (MBL <0>, /MBL <0>) is put between the other MBL pair (MBL <1>, /MBL <1>), and MBL <1> constituting the other MBL pair is put between the one MBL pair. In this constitution, the memory cell data is necessarily output to the side of the MBL <0> and the MBL <1>, and thus the interference noise which may be generated in the MBL pair can be prevented from being generated.

Fifth Embodiment

Figure 9:
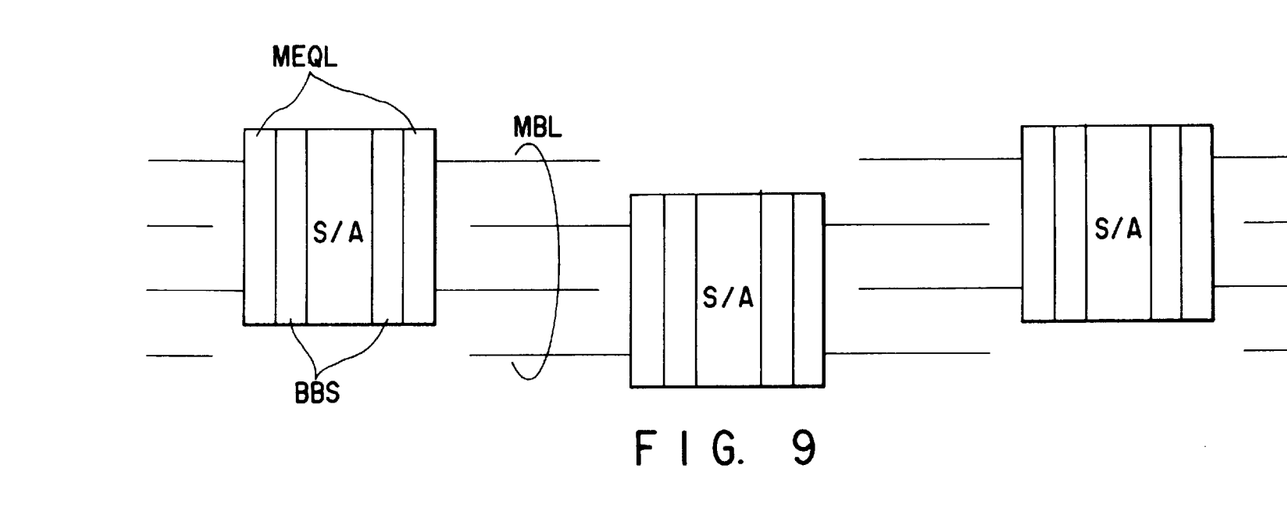
FIG. 9 is a schematic diagram showing a basic structure of the multilayered bitline structure of the memory device according to the fifth embodiment.

FIG. 9 is a schematic diagram showing a basic structure of the multilayered bitline structure of the DRAM according to the fifth embodiment. In the present embodiment, the sense amplifiers connected to the MBL pairs are arranged on the right and left sides of the MBLs and shared by the MBL pair in the adjacent block. The SBLs not immediately related to this embodiment are not described in the drawing.

In order to share one sense amplifier by the two MBL pairs of the adjacent blocks, the sense amplifier needs to be selectively connected to one of the MBL pair on the right and left sides. Therefore, there is located a block select circuit (BBS) between the sense amplifier and the MBLs. Further, in order to maintain the potential of the MBLs the precharge state or the non-active state at a precharge potential (VBL), a MBL equalizing circuit (MEQL) is provided to each of the MBL pairs.

With this constitution, the number of the sense amplifiers which have the largest area in the various active elements in the circuit can be decreased. By decreasing the number of the sense amplifiers in this manner, the total chip area can be decreased and the high integration of the device can be attained.

Sixth Embodiment

Figure 10:
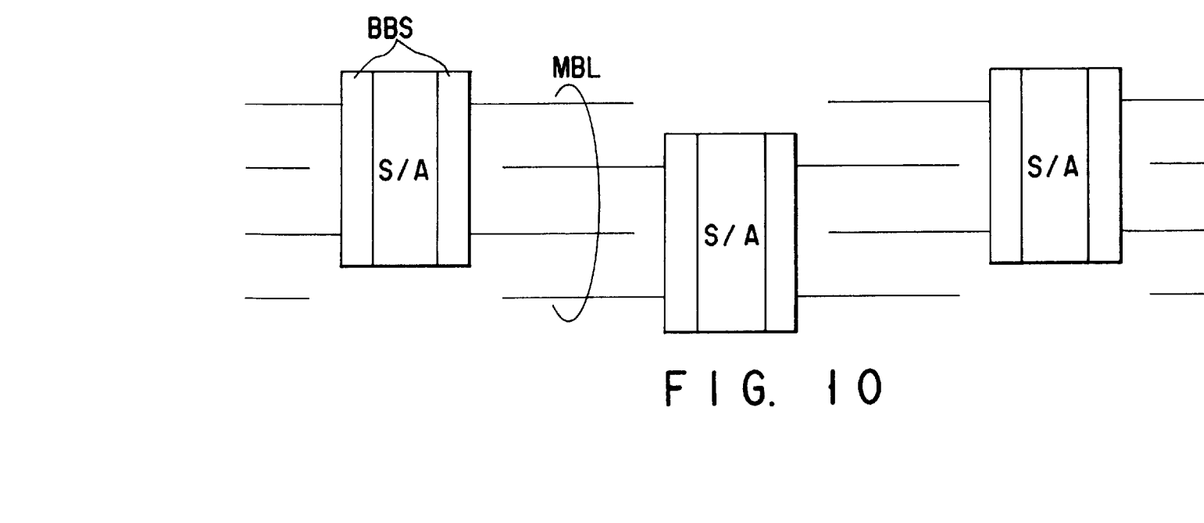
FIG. 10 is a schematic diagram showing a basic structure of the multilayered bitline structure of the memory device according to the sixth embodiment.

FIG. 10 is a schematic diagram showing a basic structure of the multilayered bitline structure of the DRAM according to the sixth embodiment. The present embodiment differs from the embodiment shown in FIG. 9 in the point that the MBL equalizing circuits (MEQLs) used in the embodiment shown in FIG. 9 are not provided.

The equalizing of the MBLs is performed by a SBL equalizing circuit (SEQL) via SBLs and the SSW circuit, and all the signals input to the SSW circuit at the precharge state are set at a "H" level. When the RAS is set at an active state, all the signals other than the SSW circuit input signal the selected SBL are set at a "L" level.

As described above, in the present embodiment, the SEQL circuit is used to equalize the MBLs, and the MEQL circuit is not required for each of the MBLS, and the decrease of the chip size and the high integration of the device can be attained.

It is understood that the present invention is not limited to the embodiments described above. In the above embodiments, the structures in the DRAM are described, but the present invention can be similarly applied not only to the other memory device such as SRAM and PROM, each of which contains a problem of a noise between adjacent bitlines, but also to a FRAM having a similar structure to that of a DRAM. The number of the SBLs in the block and the number of the blocks can be changed in accordance with the specification of the device. The other various changes and modifications may be effected in the present invention by one skilled in the art without departing from the scope or spirit of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. A semiconductor memory device, comprising:
   a memory cell array having a plurality of memory cells, said memory cell array being divided into a plurality of blocks;
   a plurality first bitlines arranged in each of the blocks, said plurality of first bitlines forming a plurality of first bitline pairs each having a folded bitline structure with two of said plurality of first bitlines as a basic unit;
   a plurality second bitlines arranged to correspond to at least one of the blocks and formed above the first bitlines, said plurality of second bitlines forming a plurality of second bitline pairs each having a folded bitline structure with two of said plurality of second bitlines as a basic unit;
   a plurality of sense amplifier circuits, arranged to correspond to said plurality of second bitline pairs, for detecting and amplifying information stored in the memory cells; and
   a plurality of select circuits for selecting one of two of first bitlines included in one of said plurality of first bitline pairs to selectively connect a selected first bitline with one of two of second bitlines included in one of said plurality of second bitline pairs, wherein each of said plurality of second bitline pairs has a first end and a second end, and said plurality of sense amplifiers are arranged on a side of the first end and a side of the second end.

2. The semiconductor memory device according to claim 1, wherein said plurality of second bitline pairs are connected to the sense amplifiers arranged on a side of the first end and the sense amplifiers arranged on a side of the second end, alternately.

3. The semiconductor memory device according to claim 2, wherein data stored in the memory cells are read to the two of said plurality of second bitlines being adjacent and arranged at every two lines intervals, regardless of an input address.

4. The semiconductor memory device according to claim 1, wherein each of the memory cells has a memory cell capacitor formed above said plurality of first bitline pairs.

5. The semiconductor memory device according to claim 1, wherein the select circuits are arranged on both ends of each of said plurality of blocks.

6. The semiconductor memory device according to claim 1, further comprising an equalizing circuit for maintaining voltages of said plurality of first bitlines at a predetermined precharge potential, said equalizing circuit provided to each of said plurality of blocks.

7. The semiconductor memory device according to claim 6, wherein said equalizing circuit performs a precharge operation of said plurality of second bitline pairs through said plurality of select circuits.

8. The semiconductor memory device according to claim 6, wherein said equalizing circuit is shared by adjacent two blocks of said plurality of blocks.

9. The semiconductor memory device according to claim 8, wherein said equalizing circuit performs a precharge operation of said plurality of second bitline pairs through said plurality of select circuits.

10. The semiconductor memory device according to claim 1, wherein each of the sense amplifier circuits is shared by two of said plurality of second bitline pairs, and further comprising an equalizing circuit for maintaining voltages of said plurality of second bitlines of each of the second bitline pairs at a arbitrary precharge level.

11. A semiconductor memory device, comprising:

a memory cell array having a plurality of memory cells, the memory cell array being divided into a plurality of blocks;

a plurality first bitlines arranged in each of the blocks, said plurality of first bitlines forming a plurality of first bitline pairs each having a folded bitline structure with two of said plurality of first bitlines as a basic unit;

a plurality second bitlines arranged to correspond to at least one of the blocks and formed above the first bitlines, said plurality of second bitlines forming a plurality of second bitline pairs each having a folded bitline structure with two of said plurality of second bitlines as a basic unit;

a plurality of sense amplifier circuits, arranged to correspond to said plurality of second bitline pairs, for detecting and amplifying information stored in the memory cells; and a plurality of select circuits for selecting one of two of first bitlines included in one of said plurality of first bitline pairs to selectively connect a selected first bitline with one of two of second bitlines included in one of said plurality of second bitline pairs, wherein two pairs of said plurality of second bitline pairs constitute one unit, and one of two second bitlines included in one of said two pairs of said plurality of second bitline pairs is put between another bitline pair of said two pairs of said plurality of second bitline pairs, each of said plurality of select circuits connects a first bitline of said plurality of first bitline pairs connected to the selected memory cell with a second bitline included in one of two of said plurality of second bitline pairs put between another pairs of two of said plurality of second bitline pairs, and each of said plurality of second bitline pairs has a first end and a second end, and said plurality of sense amplifiers are arranged on a side of the first end and a side of the second end.

12. The semiconductor memory device according to claim 11, wherein said plurality of second bitline pairs are connected to the sense amplifiers arranged on a side of the first end and the sense amplifiers arranged on a side of the second end, alternately.

13. The semiconductor memory device according to claim 12, wherein data stored in the memory cells are read to the two of said plurality of second bitlines being adjacent and arranged at every two lines intervals, regardless of an input address.

14. The semiconductor memory device according to claim 11, wherein each of the memory cells has a memory cell capacitor formed above said plurality of first bitline pairs.

15. The semiconductor memory device according to claim 11, wherein the select circuits are arranged on both ends of each of said plurality of blocks.

16. The semiconductor memory device according to claim 11, further comprising an equalizing circuit for maintaining voltages of said plurality of first bitlines at a predetermined precharge potential, said equalizing circuit provided to each of said plurality of blocks.

17. The semiconductor memory device according to claim 16, wherein said equalizing circuit performs a precharge operation of said plurality of second bitline pairs through said plurality of select circuits.

18. The semiconductor memory device according to claim 16, wherein said equalizing circuit is shared by adjacent two blocks of said plurality of blocks.

19. The semiconductor memory device according to claim 18, wherein said equalizing circuit performs a precharge operation of said plurality of second bitline pairs through said plurality of select circuits.

20. The semiconductor memory device according to claim 11, wherein each of the sense amplifier circuits is shared by two of said plurality of second bitline pairs, and further comprising an equalizing circuit for maintaining voltages of said plurality of second bitlines of each of the second bitline pairs at a arbitrary precharge level.

* * * * *